United States Patent [19]

Sneed, Jr

[11] 4,110,687

[45] Aug. 29, 1978

[54] DUAL THRESHOLD LOGIC PROBE

[76] Inventor: James W. Sneed, Jr, c/o Kurz-Kasch, Inc., 1501 Webster St., P. O. Box 1246, Dayton, Ohio 45401

[21] Appl. No.: 827,301

[22] Filed: Aug. 24, 1977

[51] Int. Cl.² ...................... G01R 19/16; G01R 31/02
[52] U.S. Cl. ...................................... 324/133; 340/661
[58] Field of Search ........................ 324/51, 72.5, 133; 340/248 A, 248 B, 248 C

[56] References Cited

U.S. PATENT DOCUMENTS

| | | | |
|---|---|---|---|
| 3,341,816 | 9/1967 | Davis et al. | 340/248 A X |
| 3,544,983 | 12/1970 | Wallace et al. | 340/248 A |
| 3,619,775 | 11/1971 | Naylor et al. | 324/133 X |
| 3,628,141 | 12/1971 | Union et al. | 324/133 X |
| 3,673,588 | 6/1972 | Riff | 340/248 A |
| 3,742,351 | 6/1973 | Palmer et al. | 324/133 X |
| 3,838,339 | 9/1974 | Brandt | 324/133 |
| 4,005,365 | 1/1977 | Berger et al. | 324/133 |

FOREIGN PATENT DOCUMENTS 2,134,329  1/1973  Fed. Rep. of Germany .......... 324/133

OTHER PUBLICATIONS

Czechlewski et al., *Pulse and Level Detector Circuit,* Western Electric Tech. Dig. No. 35, Jul. 1974, pp. 11–13.

*Primary Examiner*—Gerard R. Strecker
*Attorney, Agent, or Firm*—Biebel, French & Nauman

[57] ABSTRACT

A logic probe includes a first lamp for indicating an input voltage level above a first predetermined magnitude or upper threshold, a second lamp for indicating an input voltage below a second predetermined magnitude or lower threshold, and a pulse lamp for indicating the change in the input voltage level. Circuit means are provided to control the operation of the third or pulse lamp so that the lamp operates in accordance with the position of a selector switch. When the switch is in a first position, the pulse lamp will operate in response to a change in the input voltage level through either one of the thresholds, and when the switch is in the second position, the pulse lamp will operate only if the input voltage level transitions both thresholds within a predetermined time.

6 Claims, 6 Drawing Figures

DUAL THRESHOLD LOGIC PROBE

BACKGROUND OF THE INVENTION

This invention relates to a logic probe for determining the logic level of a selected part of a circuit, and more particularly to a logic probe including a pulse light for indicating transitions of measured voltage levels from one logic condition to another.

In a logic probe, such as the one shown in U.S. Pat. No. 3,525,939, a logic probe is shown in which a first lamp is energized whenever the voltage level at the tip of the probe is above a first predetermined magnitude or threshold level, which may be referred to as a logic "1," logic true, or high condition. A second lamp, which might be a different color, indicates a voltage at the tip is below a second predetermined magnitude or threshold level, less than the first predetermined level, sometimes referred to as a logic "0," logic false, or low condition. Neither light is illuminated if the voltage at the probe is between these two predetermined voltage levels — a voltage range commonly referred to as the deadband.

When measuring steady state input voltage to the probe, and assuming the circuit under test is operating properly, either the logic "1" or the logic "0" lamps will be energized. When the probe is connected to a circuit which is transitioning from the logic "1" to the logic "0" conditions, and wherein the duty cycle is fifty percent, both the logic "1" and the logic "0" lamps will appear to be energized simultaneously, and with equal brilliance. As the duty cycle is varied, however, one of the lamps may become too dim to indicate that a pulse is actually transitioning into that logic state, even momentarily. For this reason, a circuit is added to the logic probe which senses the transition of the measured input voltage through the threshold level, and this circuit causes a pulse lamp to energize to indicate that the input signal is not steady state as might appear from observing only the "1" and "0" lamps.

It has been found, however, that the pulse lamp will be energized whenever the measured voltage transitions across one threshold level, and the circuit under test may in fact be defective in that the input is not transitioning completely through the deadband from one logic condition to another. Therefore, the assumption that the operator makes based on his observation of the logic level lamps and the pulse lamp may be in error.

SUMMARY OF THE INVENTION

This invention relates to an improved logic probe wherein the pulse lamp will be energized only if a signal at the tip of the probe transitions across both the upper or first predetermined voltage level and the lower or second predetermined voltage level.

The invention includes circuit means which senses the transition of a signal at the tip through both the first and second predetermined voltage magnitudes or threshold levels and which will provide an output to a pulse lamp circuit only if the input signal transitions through both levels within a predetermined time period.

The logic probe preferably includes an electrically conductive tip mounted at the end of a housing which is small enough to be hand held. Power to supply the logic probe circuitry and lamps may be obtained from the circuit undergoing test, or it may be supplied by a separate source, such as a battery.

The logic probe includes within the housing a first circuit having an input connected to the tip for sensing when the voltage level on the tip is greater than a first predetermined magnitude, and an output from this circuit is connected to a first indicator lamp for indicating this condition; a second circuit having its input also connected to the tip for this circuit sensing when the voltage level on the tip is less than a second predetermined magnitude which is lower than the first predetermined magnitude, and its output is connected to a second indicator lamp for indicating the existence of this condition; and a third circuit having its input connected to both the first and second circuit means for providing an output to a third indicator lamp whenever the voltage level at the tip of the logic probe transitions through both said first and second predetermined magnitudes in at least one direction, preferably within a predetermined period of time.

A switch may be provided in one of the inputs to the third circuit means to permit the logic probe to operate as a prior art device, that is, for causing the pulse lamp to be energized whenever the voltage at the probe tip transitions through only one of the predetermined voltage levels. This feature is sometimes valuable to the operator in diagnosing a malfunction in the circuit being tested.

Accordingly, it is an object of this invention to provide a logic probe having circuit means for energizing a first lamp to indicate a logic high condition when the voltage applied to an input tip of the probe is above a first predetermined level, for energizing a second lamp to indicate a logic low condition when the voltage on the probe is below a second predetermined level, and for energizing a third lamp to indicate a pulse or transition of voltage from one logic condition to another, wherein the improvement comprises means responsive to the voltage on the probe transitioning from one logic condition to another through both of said predetermined voltage levels within a predetermined period of time for providing an output, and means responsive to said output for controlling the operation of said third lamp to indicate said transition across both predetermined voltage levels.

Other objects and advantages of the invention will be apparent from the following description, the accompanying drawings and the appended claims.

DESCRIPTION OF THE PREFERRED EMBODIMENTS

Figure 1:
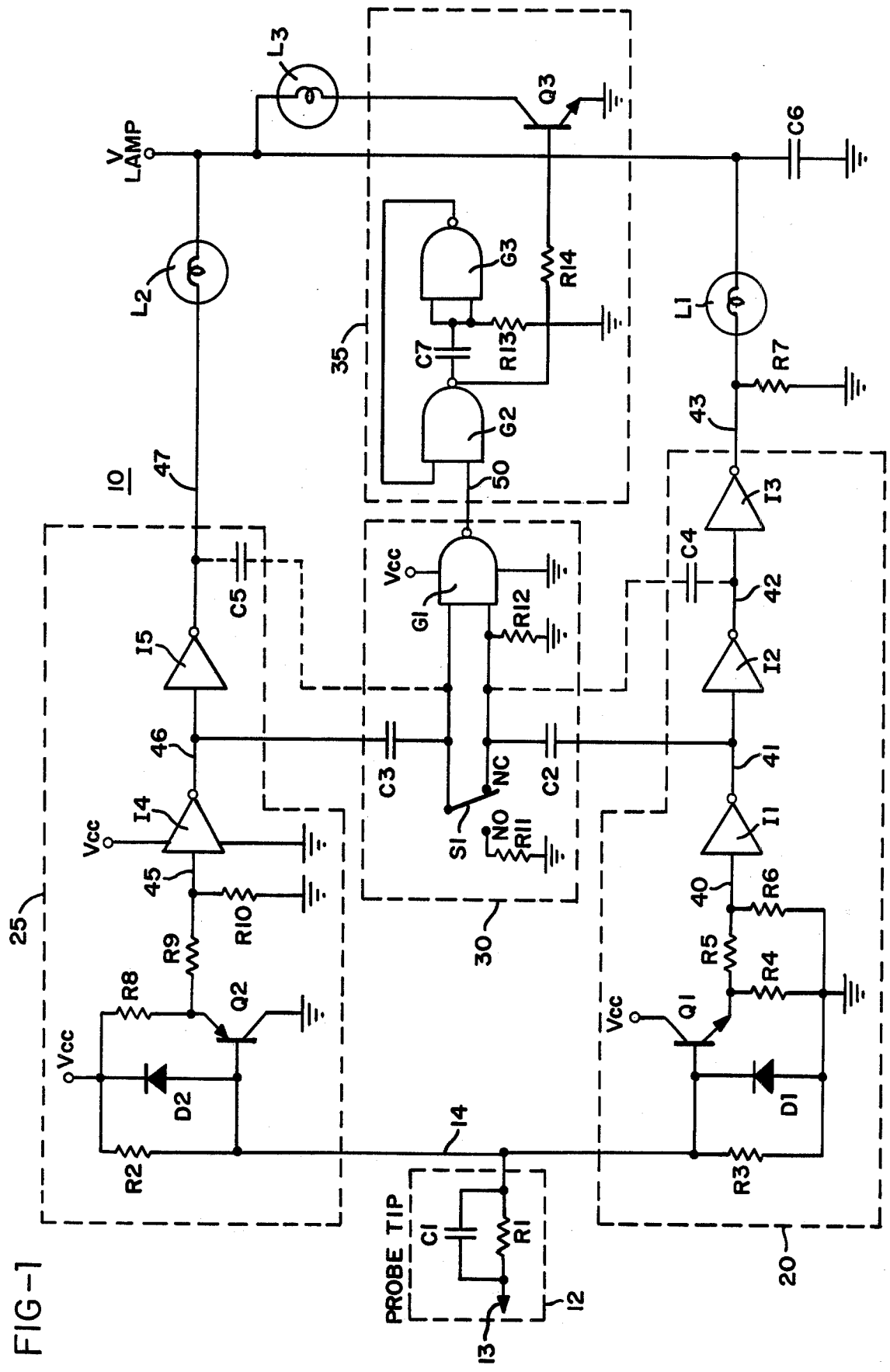
FIG. 1 is an electrical schematic of a logic probe constructed according to this invention.

Referring now to the electrical schematic diagram of FIG. 1, a logic probe 10 constructed according to this invention is provided with an electrically conductive tip 12 which includes a contact element 13 and a decoupling circuit including resistor R1 and capacitor C1. The output of the tip on line 14 is connected to a first circuit means 20, which senses when the voltage level on the tip is greater than a first predetermined magnitude and which controls the operation of a first indicator lamp L1, and also to a second circuit means 25 which senses when the voltage on the tip 12 is less than a second predetermined magnitude lower than the first predetermined magnitude and which controls the operation of the second indicator lamp L2. The logic probe also includes a third circuit means 30 which is electrically connected to both the first and second circuit means and which has an output connected to a circuit means 35 for controlling the operation of a third or pulse lamp L3.

While the circuit shown in FIG. 1 is designed primarily for use with transistor-transistor logic (TTL), it should be understood that the circuit or its functional equivalent may be used with other logic families. Although no power source is shown, the logic probe 10 may obtain its power from either the circuit undergoing test or from a separate power supply with a common ground. The terminals marked Vcc, for example, are preferably connected to a common lead which may in turn be connected to a source of positive voltage used to power the logic under test. The ground system may also be connected to system ground or to a source of negative voltage.

Whenever the tip 12 of the probe is not connected to either a source of voltage or to a low impedance device, the tip will assume a voltage determined by Vcc and the values of resistors R2 and R3. These resistors place the tip 12, along with the bases of transistors Q1 and Q2 at a voltage which is in the approximate center of the socalled deadband. For TTL logic, the deadband is between approximately 0.8 and 2.4 volts. With the voltage at the tip 12 in the deadband, both lamps L1 and L2 will be off for the following reasons.

When the voltage at the probe tip 12 is within the deadband, the voltage at the base of transistor Q1 will be below the upper threshold value, set at approximately 2.4 volts, and therefore this transistor will be gated off. Accordingly, the input on line 40 to inverter I1 will be low, its output on line 41 to inverter I2 will be high, the voltage on line 42 will be low, and the output of inverter I3 on line 43 will be high, or approximately Vcc. Since the voltage on both sides of the lamp L1 is high, the lamp will be off.

Similarly, with the voltage of tip 12 within the deadband, the base of transistor Q2 will be in excess of the lower threshold limit, set at approximately 0.8 volts, and this transistor will be gated off causing the voltage on line 45 to inverter I4 to be high, the output of which on line 46 will be low, and the output on line 47 to be high. Lamp L2 will therefore also be off.

When the probe tip is first connected to a circuit having a voltage higher than the upper threshold limit, transistor Q1 will be gated on, and this will cause lamp L1 to be energized and illuminated. Similarly, if the tip 12 is connected to ground, or to a voltage source less than the lower threshold limit, transistor Q1 will be gated off and transistor Q2 will be gated on to cause lamp L2 to be illuminated.

The circuit 10 may be connected to operate as a prior art device, that is, to provide a pulse indication whenever the voltage at the probe tip transitions through either one of the predetermined voltage levels. This is done by positioning switch S1 within the circuit 30 to the normally closed (NC) position, as shown. In this mode of operation it will be noted that the output of inverter I1 (circuit 20) on line 41 is coupled through capacitor C2 to one input of NAND gate G1, while the output of inverter I4 (circuit 25) is connected through capacitor C3 to the other input of gate G1. With the switch S1 in the NC position, both inputs are connected together, and therefore any positive going voltage on either line 41 or line 46 will provide simultaneous inputs to gate G1 which will then provide an output on line 50 to the pulse lamp circuit 35. This circuit 35 includes gates G2, G3 and transistor Q3 and functions as a pulse stretcher, that is, each time an input is applied thereto, the pulse lamp L3 will be illuminated for a period of time sufficient to be visible to the operator. The time in which lamp L3 is illuminated is determined by the RC network including a capacitor C7 and resistor R13.

Because a positive going signal on either line 41 or 46 will be sufficient to energize the pulse lamp L3, it may be noted that it is not necessary that the input signal on the probe transition both threshold levels established for transistors Q1 and Q2; it is necessary only that one threshold level be crossed in such a direction as to cause a positive going pulse to be applied to the inputs of gate G1.

As a modification, capacitors C4 and C5 may be connected between lines 42 and 47, respectively, and the inputs of gate G1 either in place of or in addition to capacitors C2 and C3. Capacitors C2 and C3 couple positive going pulses to the inputs of gate G1 whenever the voltage at the tip 12 is transitioning in a negative going direction; and capacitors C4 and C5 will therefore connect positive going pulses to the inputs of gate G1 whenever the input on tip 12 is transitioning through both predetermined magnitudes in a positive going direction.

In the present invention, when switch S1 is moved to the normally open (NO) position, and positive going pulses on lines 41 and 46 must occur nearly simultaneously in order for an output to be generated on line 50 from gate G1 to activate the circuit 35 and the pulse lamp L3.

In order for gate G1 to provide an output, the voltage at both inputs must be high at the same time, or nearly coincident depending on the characteristics of the gate G1, and this requires near simultaneous positive going pulses on lines 41 and 46 or lines 42 and 47. The width of the pulses applied to the input of gate G1 through capacitors C2-C5 depend upon the values of these capacitors and the values of resistors R11 and R12, and this pulse width will therefore determine how nearly coincident the pulses must occur before a pulse indication will be provided.

Thus improperly shaped pulses, even though they may transition through both thresholds, will not actuate the pulse lamp L3 when switch S1 is in the NO position.

Thus, with switch S1 in the NO position, two conditions must be met before the pulse lamp will be energized: the input signal must transition through both the first and second magnitudes, and this transition must occur within predetermined time limits.

Switch S1 is preferably a push button switch located near the tip of the probe for easy actuation by the finger tip of the operator, thus allowing the operator to change the mode of operation of the probe and thus detect whether pulses are occurring and whether these pulses are of the proper wave form and magnitude.

Thus, a logic probe constructed according to this invention is a valuable tool in allowing a technician to detect proper operation of the various components, especially within a printed circuit board, where the voltage levels representing logic states can be measured and where these voltage levels may be changing rapidly to determine whether the circuit is functioning properly.

The components used in the circuit of FIG. 1 are identified in Table I.

TABLE I

| Resistors (ohms) | Capacitors |
|---|---|
| R1 10K | C1 47 pf |
| R2 150K | C2-C5 = 22 pf |
| R3 82K | C6 .1 mfd |
| R4 680 | C7 47 mfd |
| R5 330, 1% | |
| R6 820, 1% | Transistors |
| R7 220 | Q1 2N3904 |
| R8 470, 1% | Q2 2N3906 |
| R9 150, 1% | Q3 2N3646 |
| R10 470, 1% | |
| R11 1K | Integrated Circuits |
| R12 1K | I 74504 |
| R13 820 | G 74500 |
| R14 470 | |
| | Diodes |
| | D1, D2 1N4148 |

Figure 2:
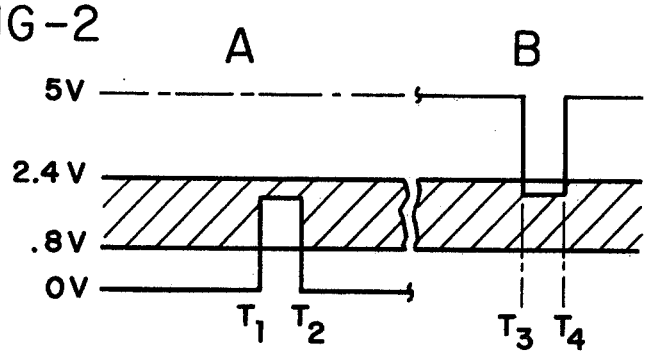
FIG. 2A and 2B are waveform diagrams illustrating the operation of the logic probe in the prior art mode.

FIGS. 2A and 2B illustrate the operation of a device in the prior art mode, or when switch S1 is in the NC position. FIG. 2A illustrates when the voltage at the tip of the probe transitions from below the lower threshold into the deadband and then returns to a value below the lower threshold. When the input voltage transitions into the deadband, at time T1, transistor Q2 (FIG. 1) will be gated off, causing the voltage on line 45 to rise, and causing a negative going voltage on line 46. This negative going voltage is coupled through capacitor C3 to the input of gate G1; however since this gate operates only on positive going pulses, no pulse lamp operation results. At time T2, transistor Q2 is again gated on, lowering the voltage on line 45, and causing the voltage on line 46 to be positive going. This causes a positive going pulse to be coupled through a capacitor C3 to both inputs of gate G1, through switch S1, and thus an output is generated on line 50 to actuate the pulse lamp L3.

Similarly, whenever a voltage which was above the upper threshold transitions downwardly through the upper threshold level, as shown in FIG. 2B, transistor Q1 will be gated off, causing the voltage on line 40 to decrease, thereby causing a positive going voltage on line 41 which is coupled through capacitor C2 and switch S1 to both inputs of gate G1. Again, the pulse lamp will be energized at time T3.

When the switch S1 is placed in the NO position, the logic probe will provide a pulse lamp indication only if the input voltage level transitions across both upper and lower predetermined threshold levels.

Figure 3:
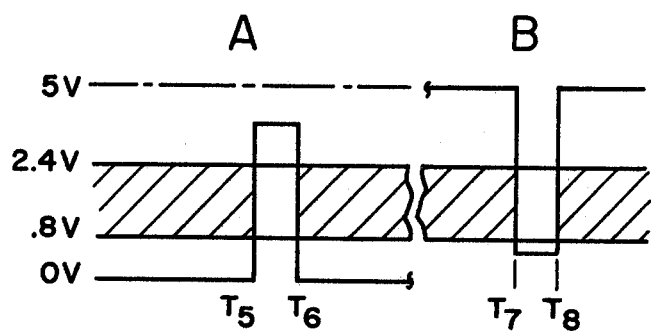
FIGS. 3A and 3B are waveform diagrams illustrating the operation of the logic probe when operated in accordance with this invention.

FIG. 3A illustrates when the voltage at the tip of the probe begins at a level below the lower threshold and has a positive going portion which transitions in a positve going direction through the deadband at time T5 and then again through the deadband in a negative going direction at time T6. Similarly, FIG. 3B illustrates a voltage level on a probe which initially begins above the upper threshold and transitions completely through the deadband at time T7 and then returns to its original level at time T8.

When using the circuit shown in FIG. 1, it is only the negative going portion of the pulses, such as shown at times T6 and T8 which will cause the pulse light to be energized if only capacitors C2 and C3 are employed. The addition of capacitors C4 and C5 will permit the pulse lamp to be operated during the positive going portions of both pulses (at times T5 and T7).

Figure 4:
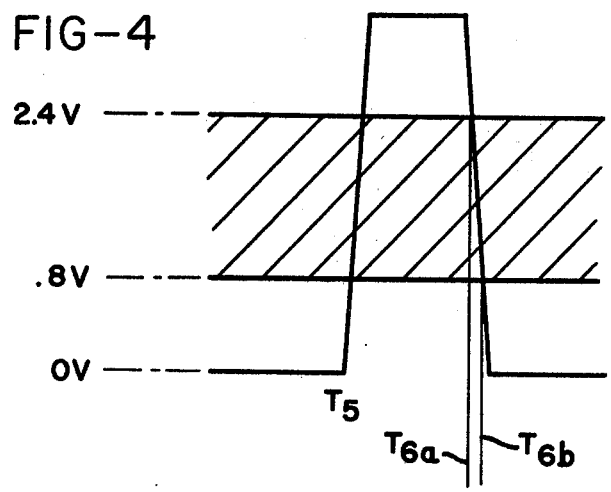
FIG. 4 is an enlarged portion of the waveform shown in FIG. 3A for illustrating the sensitivity of the logic probe to the slope of the input pulse.

FIG. 4 is an enlargement of the pulse of FIG. 3A. It will be noted that the negative going portion of the pulse passes through the upper threshold level at time T6a and then through the lower threshold level at time T6b. The spacing or time interval between these events must be such that there is an overlap of input signals to the gate G1 in order for that device is provide an output on line 50 to the circuit 35 and thus energize the pulse lamp. Accordingly, if the slope of the waveform shown in FIG. 4 is too shallow, no pulse lamp indication will be provided when the switch S1 is in the NO position, although a pulse lamp indication would be indicated when switch S1 is in the NC position, thus providing another tool to assist the operator in determining proper operation of the circuit undergoing test.

While the form of apparatus herein described constitutes a preferred embodiment of this invention, it is to be understood that the invention is not limited to this precise form of apparatus, and that changes may be made therein without departing from the scope of the invention which is defined in the appended claims.

What is claimed is:

1. In a logic probe having circuit means for energizing a first lamp to indicate a logic high condition when the voltage applied to an input tip of the probe is above a first predetermined level, for energizing a second lamp to indicate a logic low condition when the voltage on the probe is below a second predetermined level, and for energizing a third lamp to indicate a pulse or transition of voltage from one logic condition to another,
    wherein the improvement comprises
    means responsive to the voltage on said input tip for providing an output only when the voltage on said tip transitions from one logic condition to another through both of said predetermined voltage levels within a predetermined period of time, and
    means responsive to said output for controlling the operation of said third lamp to indicate said transition across both predetermined voltage levels.

2. The logic probe of claim 1 wherein said means for controlling the operation of said third lamp includes means for extending the duration said third lamp is illuminated sufficiently to provide a positive visual indication of said transition across both said predetermined voltage levels.

3. Electronic testing apparatus for indicating the voltage level of a circuit including
    an electrically conductive tip probe adapted to be placed in contact with a selected portion of the circuit,
    first circuit means electrically connected to said tip for sensing a first condition where the voltage level on the tip is greater than a first predetermined magnitude,
    a first indicator lamp connected to said first circuit means for indicating said first condition,
    second circuit means electrically connected to said tip for sensing a second condition where the voltage level on the tip is less than a second predetermined magnitude,
    a second indicator lamp connected to said second circuit means for indicating said second condition,
    a third circuit means responsive to the voltage on said input tip for providing an output only when the voltage on said tip transitions through both said first and second predetermined magnitudes in at least one direction within a predetermined period of time, and a third indicator lamp connected to said third circuit means for indicating said voltage transition.

4. Electronic testing apparatus for indicating the voltage level of a circuit including an electrically conductive tip probe adapted to be placed in contact with a selected portion of the circuit, first circuit means electrically connected to said tip for sensing a first condition where the voltage level on the tip is greater than a first predetermined magnitude, a first indicator lamp connected to said first circuit means for indicating said first condition, second circuit means electrically connected to said tip for sensing a second condition where the voltage level on the tip is less than a second predetermined magnitude, a second indicator lamp connected to said second circuit means for indicating said second condition, a third circuit means responsive to the voltage on said tip transitioning through both said first and second predetermined magnitudes in at least one direction, and a third indicator lamp connected to said third circuit means for indicating said voltage transition, said third circuit means including gate means having first and second inputs, capacitor means coupled between said inputs of said gate means and said first and said second circuit means, said gate means providing an output upon the near simultaneous input thereto of a voltage transition of the same polarity; and further circuit means having an input connected to said output of said gate means and an output connected to said third indicator lamp for providing an output pulse of a duration sufficient to provide a visual indication of the existence of a voltage pulse which traverses both said first and said second predetermined magnitudes.

5. The apparatus of claim 4 wherein said time period during which said gate means will provide an output is determined by the internal characteristics of said gate means and the value of said capacitor means.

6. The apparatus of claim 4 further including switch means for connecting the first and second inputs of said gate means whereby a voltage transition from either said first or said second circuit means will provide an output to energize said third indicator lamp.

* * * * *